(12) United States Patent
Plager et al.

(10) Patent No.: US 9,515,619 B2
(45) Date of Patent: Dec. 6, 2016

(54) AMPLIFIER ARRANGEMENT WITH LIMITING MODULE

(71) Applicant: Robert Bosch GmbH, Stuttgart (DE)

(72) Inventors: Josef Plager, Bogen (DE); Patrick Engl, Rattiszell (DE); Thomas Stein, Regensburg (DE)

(73) Assignee: Robert Bosch GmbH, Stuttgart (DE)

( * ) Notice: Subject to any disclaimer, the term of this patent is extended or adjusted under 35 U.S.C. 154(b) by 93 days.

(21) Appl. No.: 14/598,331

(22) Filed: Jan. 16, 2015

(65) Prior Publication Data
US 2015/0207471 A1 Jul. 23, 2015

(30) Foreign Application Priority Data

Jan. 21, 2014 (DE) .................. 10 2014 200 968

(51) Int. Cl.
*H03F 99/00* (2009.01)
*H03F 3/181* (2006.01)
*H03G 7/00* (2006.01)
*H03G 11/00* (2006.01)

(52) U.S. Cl.
CPC ............. *H03F 3/181* (2013.01); *H03G 7/007* (2013.01); *H03G 11/008* (2013.01); *H03F 2200/321* (2013.01)

(58) Field of Classification Search
None
See application file for complete search history.

(56) References Cited

U.S. PATENT DOCUMENTS

| | | | | |
|---|---|---|---|---|
| 5,822,442 A | * | 10/1998 | Agnew | H03G 7/08 330/278 |
| 6,940,981 B2 | * | 9/2005 | Neunaber | H03F 1/52 330/254 |
| 8,964,998 B1 | * | 2/2015 | McClain | H03G 3/32 381/106 |
| 2011/0128075 A1 | | 6/2011 | Maier et al. | |
| 2015/0319529 A1 | * | 11/2015 | Klippel | H04R 3/007 381/55 |

FOREIGN PATENT DOCUMENTS

EP         2301148         4/2012

* cited by examiner

*Primary Examiner* — Muhammad N Edun
(74) *Attorney, Agent, or Firm* — Michael Best & Friedrich LLP

(57) ABSTRACT

An amplifier arrangement for amplifying an audio input signal AES into an audio output signal AAS, having a conditioning apparatus for converting the audio input signal AES into a conditioned intermediate signal ZS. The conditioning apparatus includes an audio input interface for accepting the audio input signal and a digital data processing device. The amplifier arrangement also includes an amplifier apparatus for amplifying the intermediate signal ZS into the audio output signal AAS and the amplifier apparatus has at least one operating voltage BS. The amplifier arrangement also includes a limiting module for limiting the audio output signal AAS by changing a gain parameter VK.

9 Claims, 2 Drawing Sheets

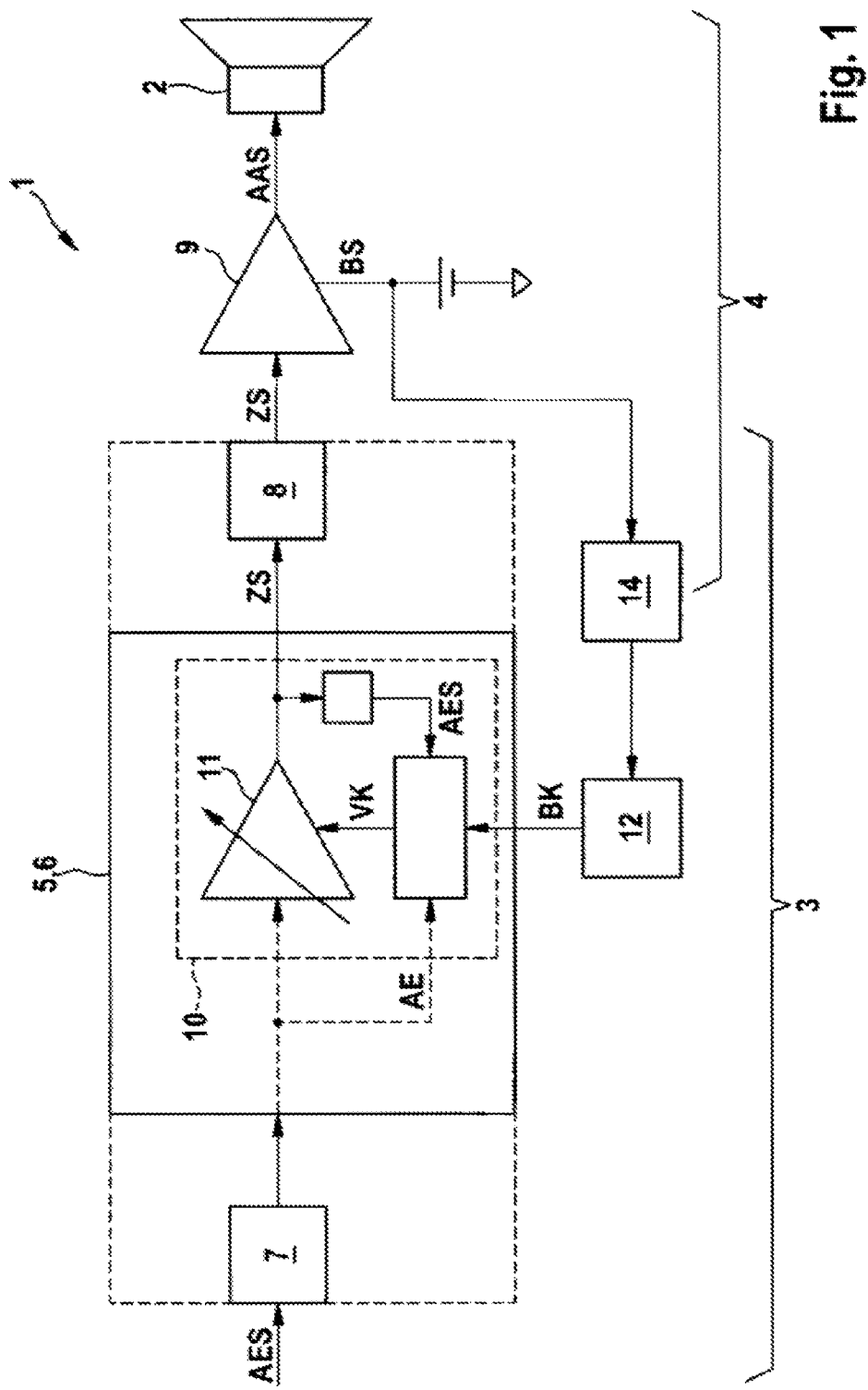

AMPLIFIER ARRANGEMENT WITH LIMITING MODULE

BACKGROUND OF THE INVENTION

The invention relates to an amplifier arrangement for amplifying an audio input signal into an audio output signal.

Audio amplifiers are generally used to amplify an input signal in linear fashion and to output it as an output signal, for example for a loudspeaker, with a higher amplitude than the input signal. Any audio amplifier has limitations in respect of the maximum possible output voltage or the maximum possible output current for the output signal. If the audio amplifier is taken to these limits by means of overdriving, limiters are usually used in order to reduce distortions in the output signal to a tolerable degree. In the event of overdriving of an audio amplifier that results in the maximum possible output voltage being exceeded, voltage limiters are used in order to avoid what is known as clipping in the output signal.

The document EP 230 1148 B1, which probably forms the closest prior art, discloses an audio amplifier for amplifying an input signal that has a limiter device that is designed to produce an intermediate signal on the basis of the input signal, and wherein the level of the intermediate signal is always limited on the basis of a settable maximum level such that the output signal does not exceed a maximum level regardless of the input signal.

SUMMARY OF THE INVENTION

The invention proposes an amplifier arrangement.

The amplifier arrangement according to the invention is designed to amplify an audio input signal into an audio output signal. In particular, the audio output signal has a higher level and/or a higher voltage amplitude than the audio input signal. By way of example, the amplifier arrangement can be used in music systems or—preferably—in public address systems, particularly for public address systems for covering expansive areas, and is designed for this purpose. The audio output signal is preferably defined as the signal that is output to electromechanical sound transducers and/or loudspeakers. The audio input signal is based on an analog signal or is in the form of the analog signal that comes from a microphone or another audio source, for example.

The amplifier arrangement comprises a conditioning apparatus that is designed to convert the audio input signal into a conditioned intermediate signal. The conditioning apparatus has an audio input interface that is designed to accept the audio input signal. In addition, the conditioning apparatus comprises a digital data processing device. By way of example, the digital data processing device is in the form of a microprocessor or—preferably—in the form of a DSP (digital signal processor). Particularly preferably, the audio input interface is in the form of a digital interface that accepts the audio input signal in digital representation. The conditioning apparatus converts the audio input signal into the conditioned intermediate signal, the conversion comprising or being able to comprise digital signal processing. In some operating states, the conditioning apparatus may be designed such that the intermediate signal corresponds to the audio input signal. However, it is preferred for the conditioned intermediate signal to be altered in comparison with the audio input signal by the digital signal processing.

The amplifier arrangement also comprises an amplifier apparatus for amplifying the intermediate signal into the audio output signal. The amplifier apparatus can also be referred to as an output stage or as a power stage. Optionally, the conditioning apparatus can be called a preamplifier stage. Particularly preferably, the amplifier apparatus implements linear amplification of the intermediate signal into the audio output signal. The amplifier apparatus is in the form of an analog amplifier apparatus that has at least one operating voltage. Depending on the design of the amplifier apparatus, it may also have two or more operating voltages. The operating voltage or the operating voltages limit the maximum amplitude of the audio output signal, and if the operating voltage limit or limits is/are reached or exceeded then the audio output signal is cut off, in particular distorted by what is known as clipping. In a preferred implementation of the invention, the amplifier arrangement is designed to have an output power of greater than 50 watts, preferably greater than 100 watts, the output power being the maximum continuous power that can be delivered with the rated impedance connected when supplied with pink noise, according to DIN 45324.

The amplifier arrangement has a limiting module—which can also be called a limiter module—that is designed to limit the audio output signal by changing a gain parameter. The particular effect achieved by the limiting module is that the audio output signal is adjusted to suit the available at least one operating voltage, and the clipping described previously is avoided or at least reduced. In particular, the output signal is kept within operating voltage limits that are conditional upon the at least one operating voltage.

The invention proposes that the conditioning apparatus has an operating voltage interface for accepting an operating voltage parameter. The operating voltage parameter corresponds to the at least one operating voltage or is an equivalent value thereof, particularly one that can be converted into the at least one operating voltage. When there are a plurality of operating voltages, the operating voltage parameter may also comprise a plurality of values and/or be in multidimensional form.

The limiting module is in the form of a program module in the digital data processing device. In this case, said program module is preferably realized such that it can estimate the at least one operating voltage from the operating voltage parameter and can estimate the audio output signal, particularly the amplitude or the level of the audio output signal, from the audio input signal. The gain parameter is adjusted via the limiting module such that the estimated audio output signal can be output at the estimated operating voltage. In particular, the estimated operating voltage stipulates one or more operating voltage limits for the audio output signal, the gain parameter being chosen such that the estimated or actual audio output signal does not or only briefly exceed(s) the operating voltage limit.

The gain parameter is applied to the audio input signal in the signal path prior to the output of the intermediate signal for the audio input signal, as a result of which the intermediate signal is changed, in particular conditioned, by the gain parameter.

In this case, it is a consideration of the invention that digital data processing devices are already existent in many amplifier arrangements in order to condition the audio input signal. The invention additionally proposes implementation of the limiting module within the digital data processing device, which means that no substantial additional hardware complexity is necessary for the limiting module.

In this case, it is of particular advantage that the response of the limiting module is stipulated in the digital data processing device in programmable fashion, particularly user-programmable fashion, and not by means of circuitry.

It is thus possible for linear and nonlinear characteristics, look-up tables, functions, predictors, observers, etc. to be able to be used in the limiting module for determining the gain parameter.

The hardware complexity is also reduced by virtue of not measuring the actual audio output signal downstream of the amplifier apparatus but rather using the operating voltage parameter to estimate only the at least one operating voltage and taking the estimated operating voltage and the estimated audio output signal as a basis for adjusting the gain parameter. The at least one operating voltage usually changes only very slowly in comparison with changes in the audio input signal or in the audio output signal, which means that the estimation of the operating voltage is very simple and robust.

The effect achieved by supplying an operating voltage parameter from the instantaneous value of the operating voltage to the conditioning apparatus, particularly the limiting module, is that the amplifier apparatus can also be operated using power supply units that have no voltage stabilization or operating voltages that change or fluctuate on the basis of a mode. The effect achieved by this is that the amplifier arrangement, particularly the audio output signal, is not driven uncontrolledly or unintentionally into a clipping range even if the operating voltage fluctuates.

In a preferred embodiment of the invention, the gain parameter is adjusted such that the peak-to-peak value (peak-to-peak amplitude) of the estimated audio output signal is less than or equal to the amplitude of the estimated operating voltage or the total amplitude of the estimated operating voltages as an operating voltage limit or limits. The effect achieved by this is that the audio output signal cannot or cannot continuously exceed the operating voltage limits conditional upon the operating voltage or operating voltages, which means that the clipping described previously is avoided.

In a preferred development of the invention, the gain parameter is adjusted in the event of a transgression above an operating voltage limit, which is provided by the estimated operating voltage(s), by the estimated audio output signal using tracking of the gain parameter with a delay time. This delay time corresponds particularly to an attack time that describes the interval of time after which the audio output signal is controlled down to the operating voltage limits following a transgression above the operating voltage limit. The delay time is preferably chosen to be greater than 1 millisecond and less than 10 milliseconds, as a result of which the actual audio output signal is driven in the clipping range, particularly cut off, for the delay time. This refinement has the advantage that the perceived overdriving of the amplifier apparatus is usually not found to be disturbing from a psychoacoustic point of view, but there is a desirable sensation of increased loudness.

In a preferred refinement of the invention, the limiting module has an amplifier model for estimating the audio output signal. In the simplest case, the amplifier model may be in the form of a linear gain factor, with the input audio signal and/or intermediate signal multiplied by the gain factor forming the audio output signal. However, it is also possible for the amplifier model to be in more complex, in particular nonlinear, form in order to be able to map the precise gain characteristics of the amplification apparatus and thereby to be able to improve the prediction quality of the estimated audio signal.

Alternatively or in addition, it is preferred for the limiting module to have an operating voltage model for estimating the at least one operating voltage. In principle, it is possible for the at least one operating voltage to be tapped off from the amplifier apparatus, measured and for the value to be supplied as an operating voltage parameter to the conditioning apparatus, particularly the limiting module. For practical reasons, however, it is preferred for the at least one operating voltage to be accepted via a voltage divider or in another way, for example, so that the operating voltage parameter forms an equivalent parameter for the operating voltage, which equivalent parameter can be converted into the at least one operating voltage using the operating voltage model.

Particularly preferably, the operating voltage parameter is in the form of an instantaneous value, or an instantaneous value scaled with a proportionality factor, for the at least one operating voltage applied to the amplifier apparatus.

In a preferred circuit refinement of the invention, the amplifier arrangement, particularly the conditioning apparatus, has an audio analog-to-digital converter for converting the audio signal from an analog representation into a digital representation. It is therefore possible for the audio analog-to-digital converter to be connected upstream of the conditioning apparatus and for the audio input interface to be supplied with a digital form of the audio input signal. Alternatively, the audio analog-to-digital converter forms an integral part of the conditioning apparatus, with the audio input interface being supplied with the audio input signal in an analog representation and said audio input signal being converted into a digital representation within the conditioning apparatus.

Alternatively or in addition, the amplifier arrangement, particularly the conditioning apparatus, comprises an operating voltage analog-to-digital converter for the operating voltage parameter. The operating voltage analog-to-digital converter may be connected upstream of the conditioning apparatus, so that the operating voltage parameter is transferred to the operating voltage interface in a digital representation. Alternatively, the operating voltage analog-to-digital converter forms an integral part of the conditioning apparatus, with the conversion from the analog to the digital representation of the operating voltage parameter taking place within the conditioning apparatus.

Since the operating voltage usually changes only very slowly and within narrow limits, it is preferred for the sampling rate and/or the resolution of the audio analog-to-digital converter to be designed to be higher than that of the operating voltage analog-to-digital converter. This measure further reduces the hardware complexity.

In a preferred implementation of the invention, the conditioning apparatus is designed to perform, by way of example, frequency-dependent level changes, dynamic changes, frequency splitting, delay, etc., on the audio input signal. Particularly preferably, the gain parameter, which may be implemented as simple multiplication by a gain factor, for example, is applied at the end of the signal path, in particular the application of the gain parameter is the last operation prior to output of the intermediate signal, in order to avoid subsequent changing of the level and/or amplitude by means of other conditioning measures.

BRIEF DESCRIPTION OF THE DRAWINGS

Further features, advantages and effects of the invention emerge from the description below of a preferred exemplary embodiment of the invention. In this case:

FIG. 1 shows a schematic block diagram of an amplifier arrangement as an exemplary embodiment of the invention;

DETAILED DESCRIPTION

Figure 2A:
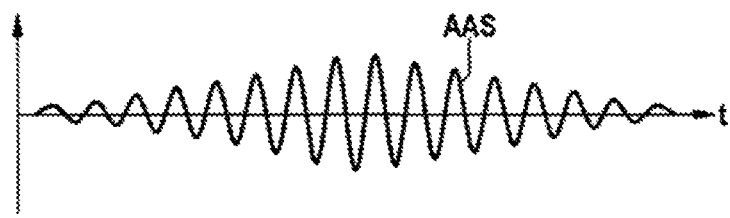
FIG. 2a,b,c schematically shows an audio input signal and two audio output signals with and without clipping.

FIG. 1 shows a schematic block diagram of an amplifier arrangement 1 as an exemplary embodiment of the invention. The amplifier arrangement 1 is used to amplify an audio input signal AES and to supply it as an audio output signal AAS to an electromechanical sound transducer, such as a loudspeaker 2. Optionally, the loudspeaker 2 forms a portion of the amplifier arrangement 1. By way of example, the amplifier arrangement 1 is used to amplify music or speech. By way of example, an amplifier arrangement 1 is used to provide sound for a restaurant, a discotheque or else a conference hall. The output power of the audio output signal AAS that is applied to the loudspeaker 2 is greater than 10 watts or greater than 50 watts, the output power being the maximum continuous power that can be delivered with the rated impedance connected when supplied with pink noise, according to DIN 45324.

By way of example, the audio input signal AES comes from a microphone or another audio source, such as an audio storage device (cassette player, MP3 player, etc.).

In functional terms, the amplifier arrangement 1 can be divided into a preamplifier section 3 and a power amplifier section 4—also called output stage. On the basis of the audio input signal AES, said audio input signal is converted into a conditioned intermediate signal ZS in the preamplifier section 3 and subsequently the intermediate signal ZS is amplified into the audio output signal AAS in the power amplifier section 4.

The preamplifier section 3 contains a conditioning apparatus 5 that is designed to convert the audio input signal AES into the conditioned intermediate signal ZS. The conditioning apparatus 5 comprises a digital data processing device 6 or is in the form thereof, the digital data processing device 6 being implemented as a DSP (digital signal processor), for example.

The audio input signal AES is converted by means of an audio analog-to-digital converter 7 from an analog representation into a digital representation, so that a digital audio input signal is available. The audio analog-to-digital converter 7 may form an integral part of the conditioning apparatus 5 or be connected upstream of the conditioning apparatus 5 as a separate component—as indicated in FIG. 1—depending on the circuitry.

The intermediate signal ZS can either be output in a digital representation and converted and amplified by the power amplification section 4 by means of an audio digital-to-analog converter 8, or alternatively the preamplifier section 3 comprises the audio digital-to-analog converter 8 that converts the intermediate signal ZS from a digital representation into an analog representation, so that an analog intermediate signal ZS is available. The audio digital-to-analog converter 8 may also be in the form of a separate component from the conditioning apparatus 5 or may form an integral portion thereof.

The intermediate signal ZS is supplied to an amplifier apparatus 9 that amplifies the intermediate signal ZS into the audio output signal AAS. The amplifier apparatus 9 is supplied with at least one internal operating voltage BS, the amplitude of the audio output signal AAS being in a form less than or equal to the amplitude of the operating voltage. The operating voltage therefore forms operating voltage limits for the audio output signal. It is also possible for the amplifier apparatus 1 to have two or more internal operating voltages that together define operating voltage limits for the audio output signal AAS.

Figure 2B:
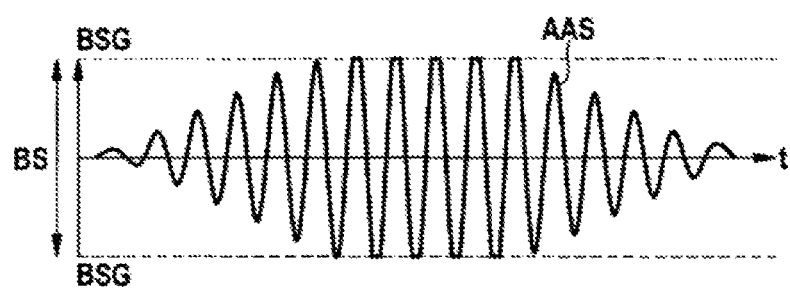
Figure 2C:
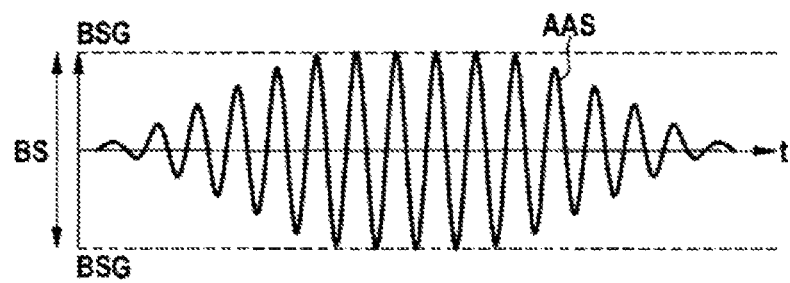

The correlation between the operating voltage BS or the operating voltage limits BSG and the output audio signal AAS is visualized in FIGS. 2a-2c.

FIG. 2a shows a highly schematic illustration of an example of an audio input signal AES, the amplitude of the audio input signal AES being plotted over time t.

FIG. 2b shows the amplified audio output signal AAS over time t in the same way. In the central timing range of the audio output signal AAS, it can be seen that the total amplitude (peak-to-peak value) exceeds the operating voltage BS or operating voltage limit BSG, as a result of which the signal peaks are cut off. This cut-off of signal peaks is also called clipping. Ultimately, the amplifier apparatus 9 is capable of amplifying the audio input signal AES linearly up to the limit of the operating voltage BS and/or up to the operating voltage limits. Depending on the design of the amplifier apparatus 9, there may also be two or more operating voltages BS provided, the operating voltages BS together forming the operating voltage limits BSG.

In FIG. 2c, the audio output signal AAS is limited such that the maximum amplitude or total amplitude of the audio output signal AAS is below the operating voltage BS or the operating voltage limits BSG. Clipping of the audio output signal is avoided as a result.

In order to implement the limiting of the audio output signal AAS, the amplifier arrangement 1 has, in the conditioning apparatus 5, as shown in FIG. 1, a limiting module 10 that comprises an amplification block 11, the amplification block 11 amplifying or attenuating the audio input signal AES in the signal path between audio input signal AES and intermediate signal ZS by means of a gain parameter VK such that the audio output signal AAS remains within the operating voltage limits BSG and/or the amplitude of the operating voltage BS. The limiting module 10 is in the form of a software module within the conditioning apparatus 5, namely within the digital data processing device 6. The form as a software module has the advantage that the limiting module is user-programmable and it is also possible to use modern technologies of digital signal processing to determine the gain parameter VK.

As input variables into the limiting module 10, the audio input signal AES is firstly tapped off or digitally branched either upstream of the amplification block 11 or downstream of the amplification block 11. In addition, an operating voltage parameter BK is supplied via an operating voltage analog-to-digital converter 12, the operating voltage parameter BK being ascertained in the exemplary embodiment in FIG. 1 by means of tapping-off of the operating voltage BS, possible level adjustment in a module 14 and conversion into a digital representation in the operating voltage analog-to-digital converter 12.

During operation, the audio output signal AAS can be estimated, in particular calculated, by means of the audio input signal AES or the intermediate signal ZS in a computation device 13 of the limiting module 10 using an amplifier model that describes the characteristics of the amplifier apparatus 9. In addition, the operating voltage BS can be estimated, in particular calculated, in the computation device 13 using the operating voltage parameter BK and using an operating voltage model.

Hence, the computation device 13 is able to compare whether the amplitude of the estimated audio output signal AAS is greater than the estimated operating voltage BS or the operating voltage limits BSG defined by the estimated operating voltage BS and, if need be, can adjust the gain parameter VK, which in the simplest case is in the form of a gain factor, and transfer it to the amplification block 11, as a result of which the gain of the audio input signal AES is chosen such that the estimated audio output signal AAS is below the estimated operating voltage BS or operating voltage limits BSG. The amplifier arrangement 1 therefore implements the limiting module 10 by means of a software module, which means that the latter can be realized without additional hardware complexity.

The invention claimed is:

1. An amplifier arrangement for amplifying an audio input signal into an audio output signal, the amplifier arrangement comprising:
   a conditioning apparatus for converting the audio input signal into a conditioned intermediate signal, wherein the conditioning apparatus includes an audio input interface for accepting the audio input signal,
   an amplifier apparatus for amplifying the intermediate signal into the audio output signal, wherein the amplifier apparatus has at least one operating voltage, and
   a limiting module for limiting the audio output signal by changing a gain parameter,
   wherein
   the conditioning apparatus has an operating voltage interface for accepting an operating voltage parameter, and the limiting module is configured to estimate at least one estimated operating voltage from the operating voltage parameter and to estimate an estimated audio output signal from the audio input signal and to adjust the gain parameter such that the estimated audio output signal can be output at the at least one operating voltage.

2. The amplifier arrangement according to claim 1, wherein the gain parameter is adjusted, as a result of which an estimated peak-to-peak value of the audio output signal is less than or equal to an amplitude, a total amplitude, or both the amplitude and the total amplitude of the at least one estimated operating voltage.

3. The amplifier arrangement according to claim 1, wherein the adjustment of the gain parameter is realized in the event of a transgression at operating voltage limits, which are stipulated by the at least one estimated operating voltage, by the estimated audio output signal by means of tracking with a delay time, as a result of which the actual audio output signal is driven in a clipping range for the delay time.

4. The amplifier arrangement according to claim 1, wherein the limiting module has an amplifier model for estimating the audio output signal.

5. The amplifier arrangement according to claim 1, wherein the limiting module has an operating voltage model for estimating the at least one operating voltage.

6. The amplifier arrangement according to claim 1, wherein the amplifier arrangement includes an audio analog-to-digital converter for the audio input signal.

7. The amplifier arrangement according to claim 6, wherein the amplifier arrangement includes an operating voltage analog-to-digital converter for the operating voltage parameter.

8. The amplifier arrangement according to claim 7, wherein a sampling rate and/or a resolution of the audio analog-to-digital converter is/are designed to be higher than that of the operating voltage analog-to-digital converter.

9. The amplifier arrangement according to claim 1, wherein the conditioning apparatus is designed for signal handling for the audio input signal by means of frequency-dependent level changes, dynamic changes, frequency splitting, delays, or a combination of the foregoing.

* * * * *